United States Patent
Perelman et al.

(10) Patent No.: US 6,744,395 B1
(45) Date of Patent: Jun. 1, 2004

(54) POWER-SCALABLE ASYNCHRONOUS ARCHITECTURE FOR A WAVE-PIPELINED ANALOG TO DIGITAL CONVERTER

(75) Inventors: Yevgeny Perelman, Haifa (IL); Eliyahu Shamsaev, Haifa (IL); Israel Wagner, Haifa (IL); Michael Zelikson, Haifa (IL)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/306,919

(22) Filed: Nov. 27, 2002

(51) Int. Cl.[7] ............................................... H03M 1/12
(52) U.S. Cl. ........................................ 341/161; 341/155
(58) Field of Search .................................. 341/155, 161

(56) References Cited

U.S. PATENT DOCUMENTS

| | | | | |
|---|---|---|---|---|
| 3,599,203 A | * | 8/1971 | Conley | 341/167 |
| 3,968,486 A | * | 7/1976 | Gerdes | 341/161 |
| 4,275,386 A | * | 6/1981 | Michel et al. | 341/159 |
| 4,489,309 A | | 12/1984 | Schlig | 341/136 |
| 4,544,914 A | * | 10/1985 | Chan et al. | 341/155 |
| 4,965,579 A | * | 10/1990 | Liu et al. | 341/159 |
| 5,043,732 A | | 8/1991 | Robertson et al. | 341/156 |
| 5,107,265 A | * | 4/1992 | Sloane | 341/146 |
| 5,572,212 A | | 11/1996 | Levinson et al. | 341/162 |
| 5,714,955 A | * | 2/1998 | Reay et al. | 341/155 |
| 6,124,820 A | | 9/2000 | Norman et al. | 341/161 |
| 6,326,914 B1 | * | 12/2001 | Sevenhans | 341/156 |
| 6,340,943 B1 | * | 1/2002 | Chow et al. | 341/161 |

OTHER PUBLICATIONS

Gilbert Promitzer, "12–Bit Low Fully Differential Switched Capacitor Noncalibrating Successive Approximation ADC with 1 MS/s", IEEE Journal of Solid–State Circuits, vol. 36, No. 7, Jul. 2001, pp. 1138–1143.

D. G. Nairn et al, Algorithmic Analogue/Digital Convertor Based on Current Mirrors, Electronics Letters, Apr. 14, 1988, vol. 24, No. 8, pp. 471–472.

Gilbert Promitzer, 12–bit Low–Power Fully Differential Switched Capacitor Noncalibrating Successive Approximation ADC with 1 MS/s, IEEE Journal of Solid–State Circuits, vol. 36, No. 7, Jul. 2001.

* cited by examiner

Primary Examiner—Peguy JeanPierre
(74) Attorney, Agent, or Firm—Stephen C. Kaufman

(57) ABSTRACT

A method for converting a signal from analog-to-digital domain. Upon receipt of an $i^{th}$ with triggering signal, where $1 \leq i \leq N$, the method includes initiating at least a partial AD operation. Upon completion of the at least partial operation, the method may includes generating and transmitting an $i^{th}+1$ triggering signal. The $i^{th}+1$ triggering signal may be adapted to initiate an $i^{th}+1$ at least partial operation, thereby creating an asynchronous process. The method further includes repeating the above operations until completion of the analog to digital conversion. In some embodiments of the present invention, upon completion of the conversion, $i=N$ and the $i^{th}+1$ operation is a power-down function.

8 Claims, 4 Drawing Sheets

POWER-SCALABLE ASYNCHRONOUS ARCHITECTURE FOR A WAVE-PIPELINED ANALOG TO DIGITAL CONVERTER

FIELD OF THE INVENTION

This invention relates generally to analog-to-digital converters (ADC), and more specifically to wave-pipelined ADCs.

BACKGROUND OF THE INVENTION

There are many analog-to-digital signal conversion (ADC) methods and apparatus. One of the well known ADC methods and apparatus is an synchronous pipeline ADC with error correction.

Reference is now made to FIG. 1A, a block diagram of prior art error correction synchronous pipeline ADC architecture 1. Reference is made in parallel to FIG. 1B, a block diagram of a prior art sample stage 10. ADC 1 may comprise a series of stages 10. Each stage 10 may typically comprise one or more sub-stages, such as a sample/hold (SH) circuit 12, ADC 14, digital to analog converter (DAC) 16, substractor 17 and amplifier 18. As is commonly known in the art, the signal flow within and between stages 10 is regulated via synchronized strobes or clock signals. In FIGS. 1A and 1B, each progressive strobe or clock signal is represented by a "clk", i.e. clk1, clk2, etc.

FIG. 1B also illustrates an exemplary flow of a analog-to-digital conversion in exemplary stage 10. An analog signal 22 is received by SH 12, which samples and holds a sample analog value 24. Upon clk1, SH 12 transfers sample 24 to ADC 14 and to substractor 17. ADC 14 converts sample 24 to a digital signal 26 representative of the sample 24. Upon clk2, ADC 14 transfers digital signal 26 to a register or latch (not shown) and to DAC 16. DAC 16 receives digital signal 26 and converts it to a reconstructed analog signal 28, representative of a quantization of sample 24. Upon clk 3, DAC 16 transmits reconstructed signal 28 to substractor 17. Substractor 17 first calculates the quantization error between sample 24 and reconstructed signal 28. Subtractor 17 then transmits the result to amplifier 18. Upon clk 4, amplifier 18 transmits multiplied signal 30 to the next stage 10. Upon the next clk (not shown) the present cycle is repeated. Each stage 10, and the elements comprised therein, progress synchronously with each other stage 10.

It is noted that the above sample is a typical known in the art routine. As an example, ADC 14 is illustrated as 1.5 bit ADC, however, may be a single bit ADC or any other known in the art ADC. Stage 10 may have various alternative elements or may proceed upon alternative paths, however, the basic principle is similar to that presented in such that the entire process is regulated via synchronized clock strobes.

A disadvantage of the above procedure is that a comparator or stage may not complete its function during the clocked period, and may hence transmit a partial, incomplete or incorrect signal. Other drawbacks are the need for dedicated complex clocking circuits, the vulnerability to clock jitter and process variations, and a non-scalable power budget.

SUMMARY OF THE INVENTION

In accordance with one aspect of the present invention, there is now provided an apparatus and method of analog-to-digital conversion, wherein the elements and stages in an analog-to-digital (AD) wave pipeline architecture are not regulated via a synchronized clock. Rather, upon completion of each stage or function, the relevant element or stage transmits a "completed" signal, or an "ACK" signal to the next element/stage. The "ACK" signal then triggers that element/stage. Each stage thus receives the time necessary for proper operation, in a manner that is independent of the sampling frequency. Due to the novel "ACK" triggering method, the present invention is robust to technology scatter, process variations, and jitter problems. This robustness is in contrast to prior art circuits wherein each element and stage is allotted a predefined clocked period, which alternatively may be too much or too little time.

Another advantage of the present invention may be the elimination of global clocks in or between the stages. Inasmuch as no global clocks are needed, the design complexity may be reduced and the risk may be lowered.

In some preferred embodiment, each stage may be powered up only when it is required to process its input data. Furthermore, all stages may be powered down upon completion of the analog-to-digital converstion process. Thus, another advantage of the present invention may be scalable power consumption via application of a lower clock frequency, resulting in a reduced average power consumption.

In accordance with one aspect of the present invention, there is now provided a method for converting a signal from analog-to-digital domain. Upon receipt of an $i^{th}$ triggering signal, where $1 \leq i \leq N$, the method includes initiating at least a partial AD operation. Upon completion of the at least partial operation, the method may includes generating and transmitting an $i^{th}+1$ triggering signal. The $i^{th}+1$ triggering signal may be adapted to initiate an $i^{th}+1$ at least partial operation, thereby creating an asynchronous process. The method further includes repeating the above operations until completion of the analog to digital conversion. In some embodiments of the present invention, upon completion of the conversion, i=N and the $i^{th}+1$ operation is a power-down function.

In accordance with one aspect of the present invention, there is now provided ananalog-to-digital (AD) wave pipeline system. The system may include a plurality of AD pipeline stages in series, each of the stages, upon receipt of an $i^{th}$ triggering signal where $1 \leq i \leq N$, may intiate an AD operation. Upon completion of the operation, each stage may generate and transmit an $i^{th}+1$th triggering signal adapted to initiate an $i^{th}+1$ operation, thereby creating an asynchronous process.

In accordance with one aspect of the present invention, there is now provided an analog-to-digital (AD) stage. The stage may include a plurality of sub-stages, each sub-stage, upon receipt of an $i^{th}$ triggering signal where $1 \leq i \leq N$, may intiate a partial AD operation. Upon completion of the partial AD operation, each sub-stage may generate and transmit an $i^{th}+1$ triggering signal adapted to initiate an $i^{th}+1$ partial AD operation, thereby creating an asynchronous process. Each sub-stage may include a shut down mechanism adapted to shut down the sub-stage when i=N and upon receipt of the $i^{th}+1$ triggering signal.

BRIEF DESCRIPTION OF THE DRAWINGS

For a better understanding of these and other objects of the present invention, reference is made to the detailed description of the invention, by way of example, which is to be read in conjunction with the following drawings, wherein.

DETAILED DESCRIPTION OF THE INVENTION

Figure 2A:
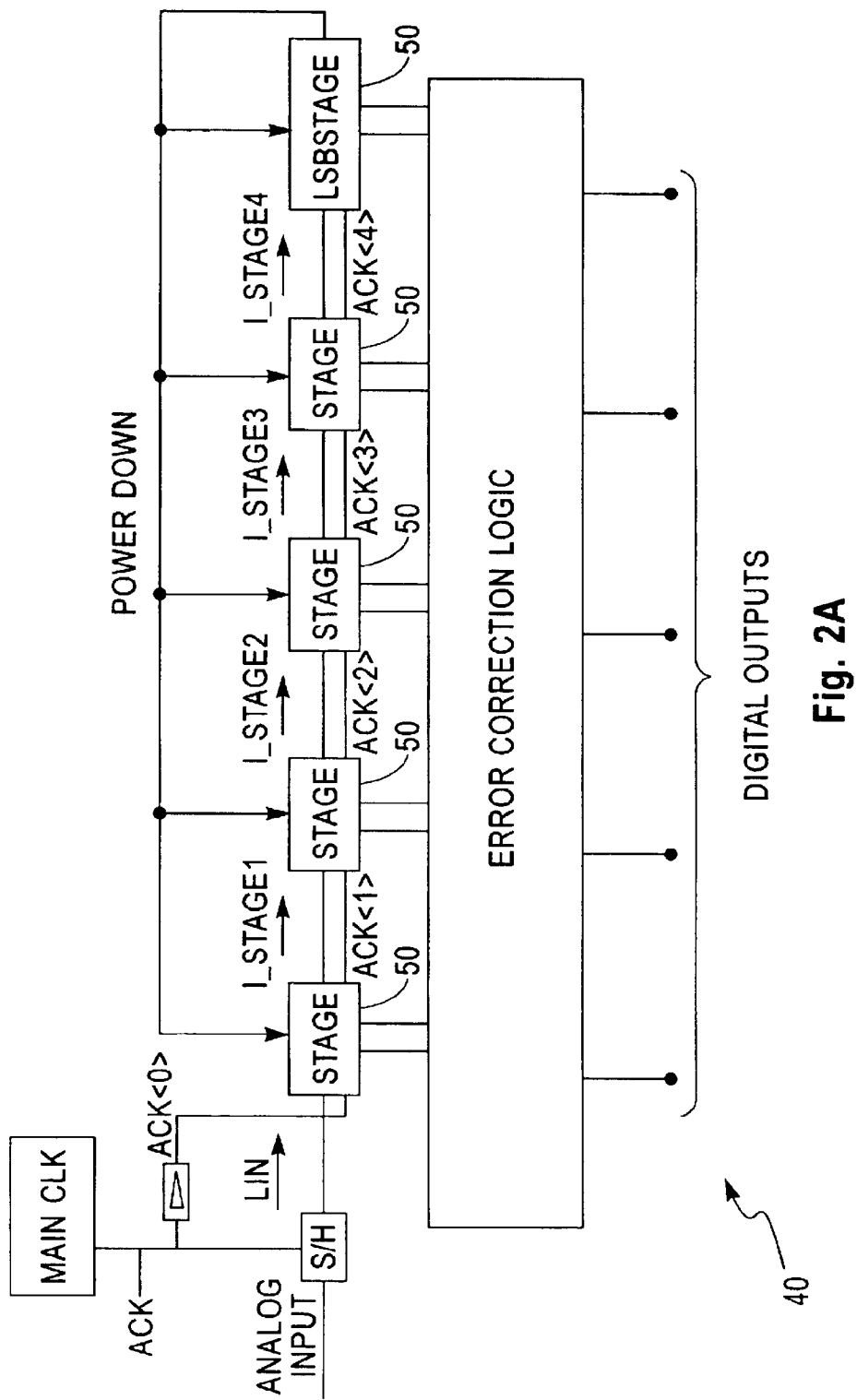
FIG. 2A is a block diagram of an asynchronous pipeline ADC circuit operable in accordance with a preferred embodiment of the invention.
Figure 2B:
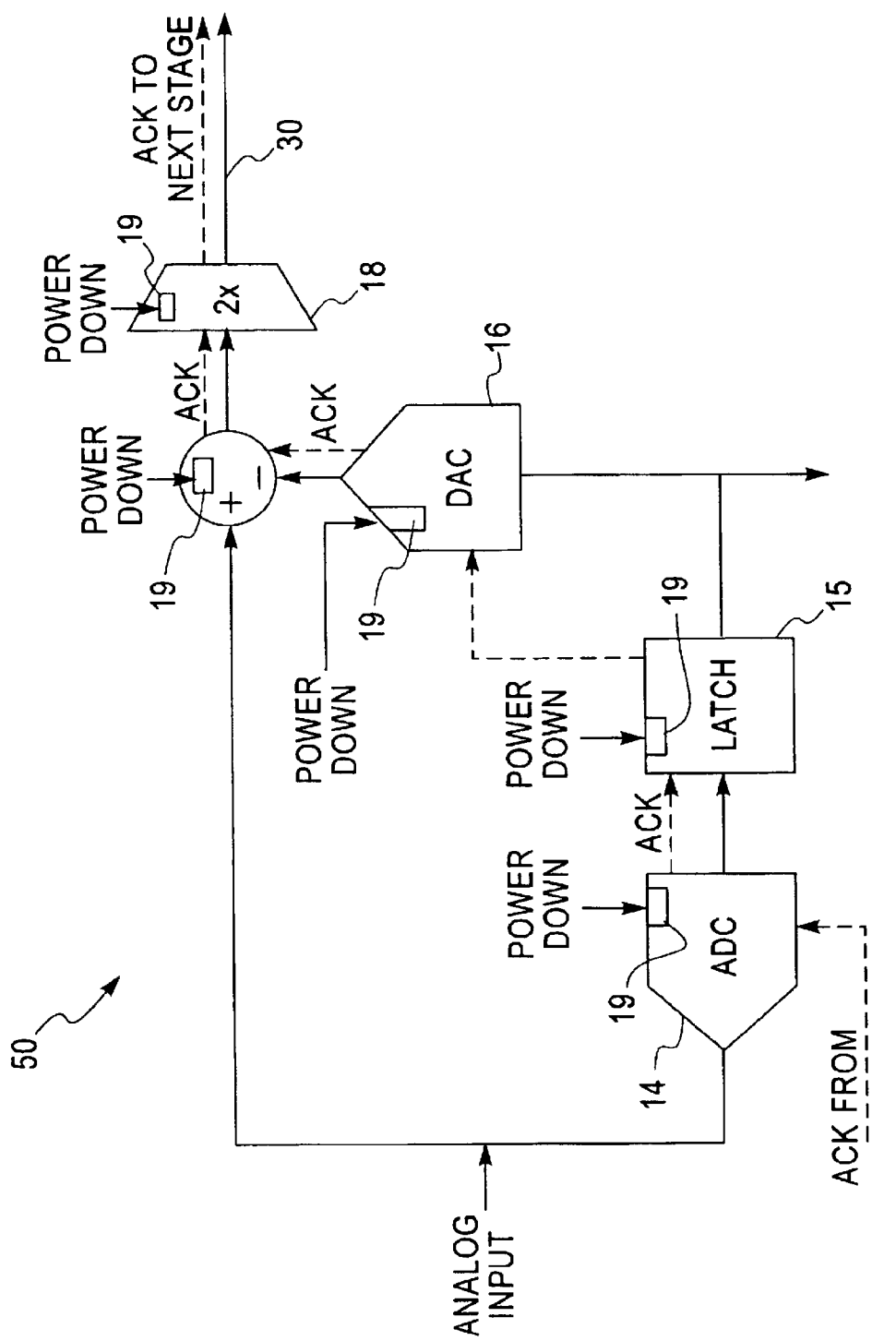
FIG. 2B is a block diagram of an asynchronous ADC stage operable in accordance with a preferred embodiment of the invention.

Reference is now made to FIG. 2A, a block diagram of asynchronous pipeline (APL) ADC architecture 40, operated and constructed in accordance with a preferred embodiment of the invention. Reference is made in parrallel to FIG. 2B, a block diagram of an asynchronous stage 50, operated and constructed in accordance with a preferred embodiment of the invention. APL 40 may comprise a series of asynchronous stages 50.

As is seen in both FIGS. 2A and 2B, APL 40 and stages 50 are not regulated via a synchronized clock. Rather, upon completion of each stage or function, the relevant element or stage transmits a "completed" signal, or an "ACK" signal to the next element/stage. The "ACK" signal then triggers that element/stage. Each progressive triggering signal is represented by progressive "ACK" signals, i.e. ACK<1>, ACK<2>, etc.

It is noted that the ability of each element to generate a "completed" signal and transmit such signal is known in the art process. Examples of such are described in "12-bit low-power fully differential switched capacitor noncalibrating successive approximation ADC with 1 MS/s" Promitzer, G. IEEE JSSC, July 2001, Page(s): 1138–1143, and included herein in its entirety, and will not be explained in detail herein.

Figure 1A:
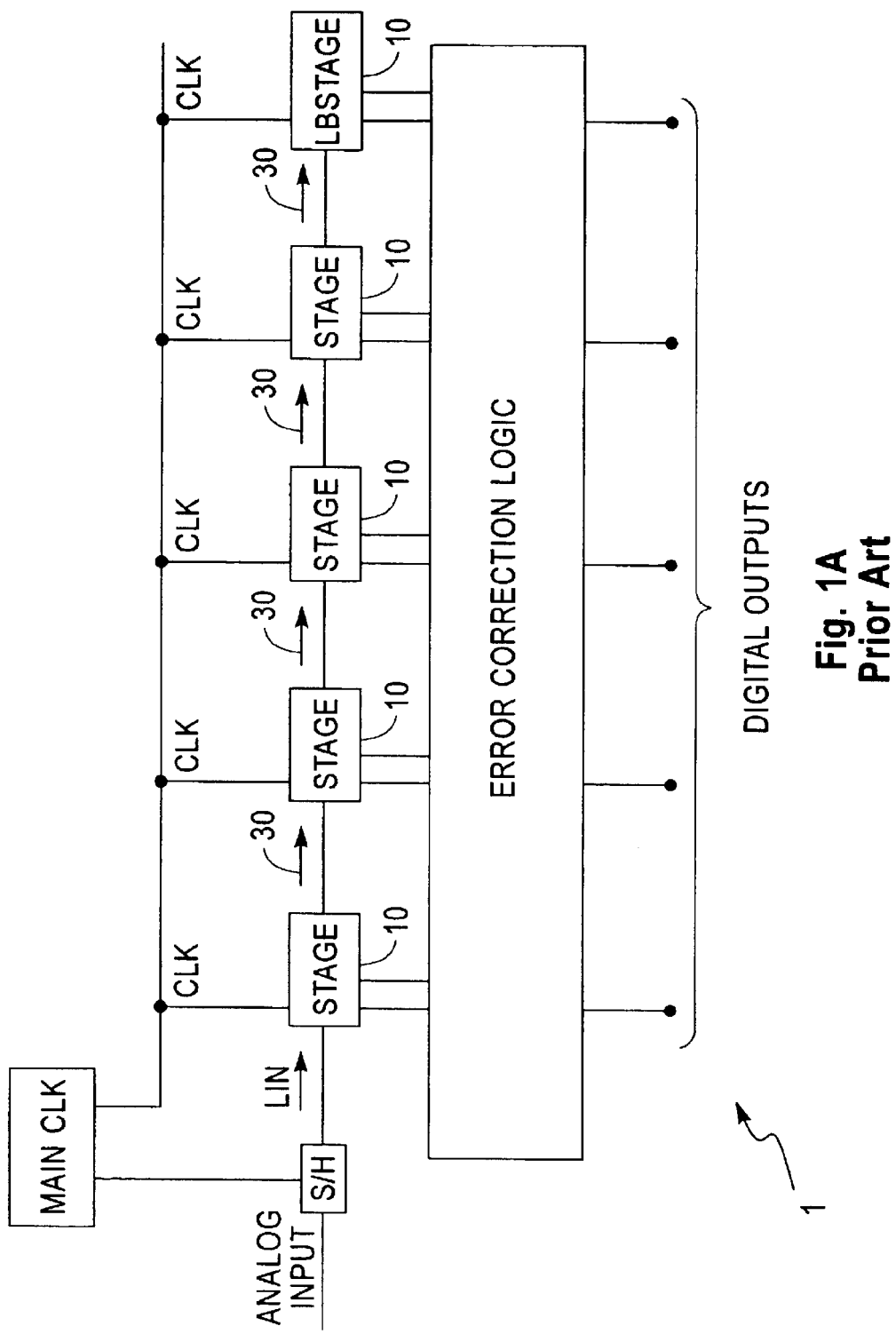
FIG. 1A is a block diagram of a a prior art synchronous pipeline ADC circuit comprising a series of stages.
Figure 1B:
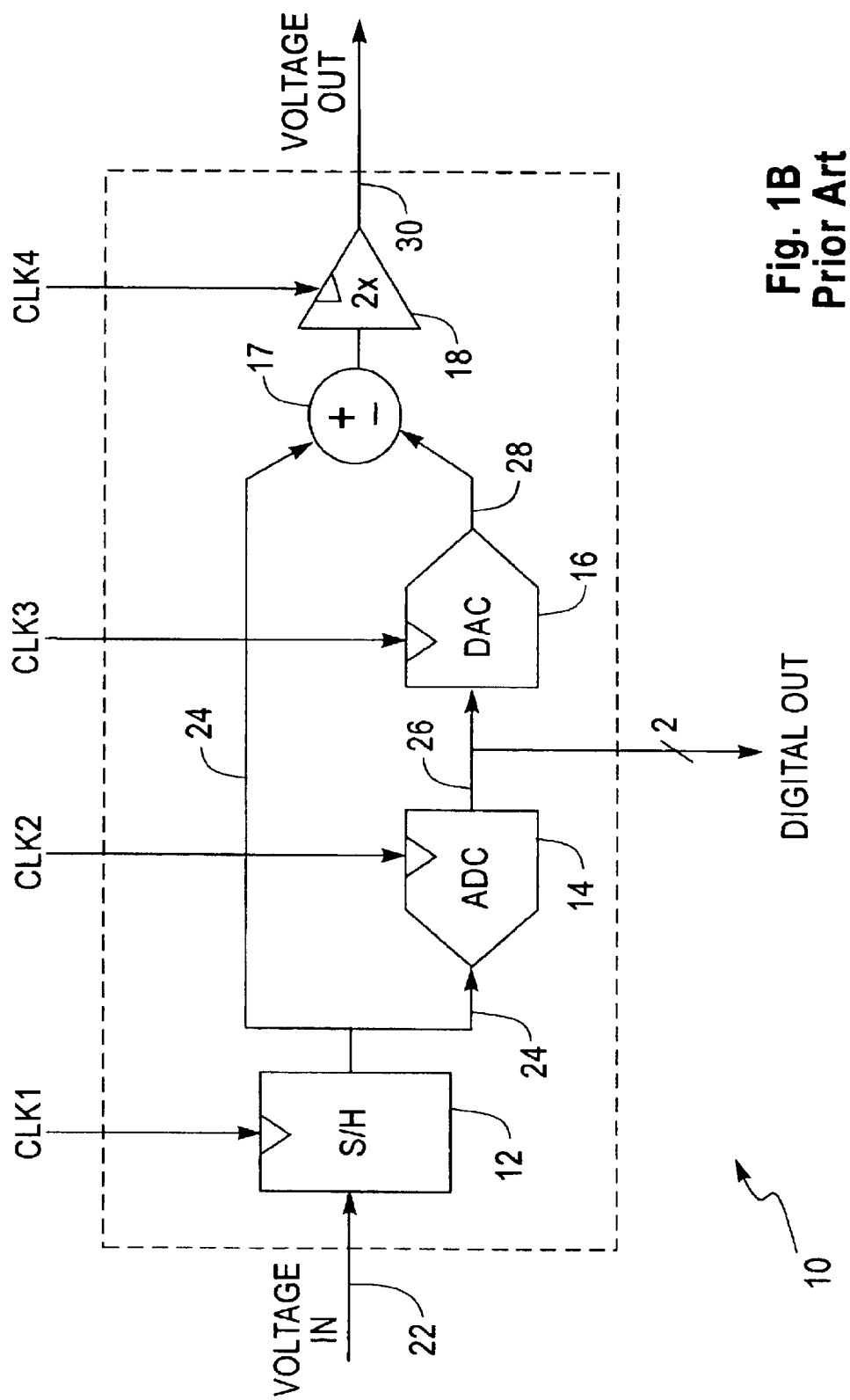
FIG. 1B is a block diagram of a prior art ADC stage.

It is apparent to one skilled in the art that the analog-to-digital functioning of stages 10 and 50 are similar, and will not be further explained herein. Inconsequential differences in the sub-stages or elements within stages 10 and 50 may exist, however the analog-to-digital conversion process is similar As an example, in FIG. 1B the register/latch which receives the digital signal 26 is not shown, however, in the embodiment presented in FIG. 2B a latch 15 is shown.

Although ADC 14 is illustrated as a 1.5 bit ADC, a preferred embodiment of the present invention may alternatively comprise a current-mode algorithmic ADC implemented with a cascade of 1-bit stages, with no clock control, i.e. comparators are working continuously. It is thus appreciated that various modification to the embodiment described herein will be apparent to a person skilled in the art and still fall within the principles of the present invention.

One of the novel aspects of the present invention is signal progression within and between stages 50 via "ACK" signal triggering. This novel method is in contrast to the known-in-the-art usage of global clocks.

In a preferred embodiment of the present invention, because all timing events are derived from the "ACK" signal, no global clocks are needed in or between stages 50. Since no global clocking is needed, the design complexity may be reduced and the risk may be lowered. Additionally, because only one clock signal may be needed (to initiate the sequence), the present clocking scheme may be much simpler than prior art systems with several different clock signals distributed throughout the ADC system.

The present invention may provide significant power saving over prior architectures in that:

1) no large clock drivers are needed, 2) the level of noise may be smaller. In prior art system not all comparators/latches lock synchronously, creating noise. Due to the asynronous nature of the present invention, the noise level may be smaller, and the analog circuits may be "relaxed" and designed more economically, and 3) no digital synchronizers are needed to align the digital outputs from the stages, thus saving $O(N^2)$ latches, for N-bit ADC.

As an asynchronous system, the APL 40 may be robust to technology scatter, process variations, and jitter problems. These robust advantages are obtained because each stage receives the time necessary for proper operation, in a manner that is independent of the sampling frequency, rather than a rigid pre-specified period.

An additional advantage of the present invention is that whereas APL 40 completes a code computation within a single clock cycle, the operation time of each analog sub-stage is limited to the period necessary to complete the relevant function. Analog sub-stages may comprise elements 14, 16, 18, stages 50 etc. As an example, DAC 16 may function for the period necessary to perform an D-to-A conversion.

Additionally, each stage 50 may be powered up only when it is required to process its input data. Furthermore, stages 50 may be powered down upon completion of the analog-to-digital converstion process. This robustness is in contrast to prior art circuits wherein each element and stage is allotted a predefined clocked period. In some instances, the predefined clocked period may alternatively be too much time, or too little. Thus, another advantage of the present invention may be scalable power consumption via application of a lower clock frequency, resulting in a reduced average power consumption.

As seen from FIG. 2C, each element in stage 50 may comprise a shut down mechanism 19. When the last stage 50 has completed it operation, the "ACK" signal from the last element in stage 50 (i.e. amplifier 18) may be transferred to the respective shut down mechanisms 19. Mechanism 19 may then cause the elements to power down. Each element will then resume operation upon receipt of an "ACK" signal, as explained in detail herein above.

In a preferred embodiment of the present invention, the comparators, such as elements 14 and 16 can work in "precharge-evaluate" cycles, and thus can be made faster and more power-efficient.

An example of possible power savings may be calculated as follows:

f—clock repetition rate, t—stage delay,

T—clock cycle time,

N—number of stages, i—specific stage number PST[i]–$i^{th}$(0<i<N) stage power dissipation, $$a = \frac{Pst[i]}{Pst[i-1]}$$

Psh—SH (Sample and Hold) power dissipation,

Ppl—power dissipation of the ADC without SH,

Ptot—ADC power dissipation.

The necessary condition for the ADC functionality is: T/t>N.

Therefore, an approximate estimation of the average power dissipation of the pipeline, ignoring set-up and hold times, is given by:

$$Ppl = Psf[0] * t * f * \Sigma(n-i)ai$$

If $t*n*f < 2^{(N+1)}$ there is no need in the SH circuit, i.e. Ptot=Ppl.

Otherwise, Ptot=Ppl+Psh.

It is noted that in common traditional pipeline ADCs, additional power optimization may be obtained by design of non-identical stages, corresponding to a <1 in the above terminology. Unfortunately, use of non-identical stages in prior art ADCs requires redesign of the entire clocking scheme. In contrast, in the present invention, due to the usage of the "ACK" triggers, the use of non-identical stages is transparent and does not require any additional circuit redesign.

It is noted that in APL architecture 40, since the entire computation may be completed within a single clock cycle, no synchronizing registers are needed and internal SH circuits 12 may be optional. These improvements may provide power consumption savings of $O(N^2)$ latches, as compared to a regular pipeline ADC. Also, there is a power/frequency tradeoff: in some preferred embodiments, k SH cells can be added along the pipeline for a k times faster sampling, and in the cost of about $O(k^2)$ more latches.

As is apparent to those skilled in the art, power scalability is an important requirement in modern integrated circuit design. Examples of the present invention offer flexible power scalability, such as an exemplary preferred embodiment of a family of pipeline APLS 40 with moderate resolution (up to 10 bit). This embodiment may be a superset design. As such, APLs 40 may be featured by lower resolution and/or lower operation frequency can be directly obtained. Alternatively, an exemplary preferred embodiment may include an APL 40 with higher operation frequencies. This may be constructed by a series connection of the proposed basic architecture, e.g. stages 50.

As seen, the novel architectural approach of asynchronous mode of operation, dynamic power up and power down of the circuit, allows for the flexible power scalability without compromising the power efficiency of a design.

It is noted that while self-timed comparators in the context of a successive-approximation (SAR) ADC are known in the art, the present invention is significantly different in several aspects. Prior art does not include power-scalability, in that it does not provide for turning-off of unused circuits. Additionally, prior art methods are not suitable for a pipeline ADC (only to a successive approximation register (SAR)).

It is noted that the utilization of the described mode of operation is not a necessary feature of the design. The features dynamic power up/power down and asynchronous operation are equally applicable to traditional, voltage mode approaches and applicable within the principles of the present invention.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

What is claimed is:

1. A method for converting a signal from analog-to-digital (AD) domain, the method comprising the steps of:
    a) initiating a first partial AD operation upon receipt of a first triggering signal directly form a previously neighboring sub-stage; and
    b) upon completion of said first partial AD operation, generating and transmitting a second triggering signal to a subsequently neighboring sub-stage adapted to initiate a second partial AD operation asynchronously.

2. The method according to claim 1, and further comprising repeating steps a) and b) until completion of said conversion.

3. The method according to claim 2, and further comprising the step of powering down wherein upon completion of said conversion.

4. An analog-to-digital (AD) stage comprising:
    a plurality of ordered sub-stages, each sub-stage adapted to:
        a) initiate a first partial AD operation upon receipt of a first triggering signal directly from a previously neighboring sub-stage, and
        b) upon completion of said first part AD operation, to generate and transmit a second triggering signal to a subsequently neighboring sub-stage adapted to initiate a second partial AD operation, asynchronously.

5. The system of claim 4, wherein each sub-stage comprises a shut down mechanism adapted to shut down said sub-stage upon completion of said partial AD operation.

6. An analog-to-digital (AD) wave pipeline system comprising:
    a plurality of AD pipeline stages in series, each of said stages adapted to
        a) initiate a first AD operation upon receipt of a first triggering signal directly from a previously neighboring stage, and
        b) upon completion of said first AD operation, to generate and transit a second triggering signal to a subsequently neighboring stage adapted to initiate a second partial AD operation, asynchronously.

7. The system of claim 6, wherein each of said stages comprises a plurality of ordered sub-stage, each sub-stage adapted to:
    a) initiate a first partial AD operation upon receipt of a first triggering signal directly from a previously neighboring sub-stage, and
    b) upon completion of said first partial AD operation, to generate and transmit a second triggering signal to a subsequently neighboring sub-stage adapted to initiate a second partial operation, asynchronously.

8. The system of claim 7, wherein each sub-stage comprises a shut down mechanism adapted to shut down said sub-stage upon completion of said partial AD operation.

* * * * *